United States Patent
Dreps et al.

(10) Patent No.: US 9,467,092 B1
(45) Date of Patent: Oct. 11, 2016

(54) PHASED LOCKED LOOP WITH MULTIPLE VOLTAGE CONTROLLED OSCILLATORS

(71) Applicant: International Business Machines Corporation, Armonk, NY (US)

(72) Inventors: Daniel M. Dreps, Georgetown, TX (US); David M. Friend, Rochester, MN (US); Grant P. Kesselring, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/941,884

(22) Filed: Nov. 16, 2015

(51) Int. Cl.
*H03L 7/06* (2006.01)
*H03B 5/12* (2006.01)
*H03K 3/03* (2006.01)
*G06F 1/26* (2006.01)

(52) U.S. Cl.
CPC *H03B 5/12* (2013.01); *G06F 1/26* (2013.01); *H03K 3/0315* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,670,833 B2 | 12/2003 | Kurd et al. | |
| 6,806,786 B1 | 10/2004 | Lam et al. | |
| 7,821,350 B2 * | 10/2010 | Dai | H03L 7/189 331/179 |
| 8,432,229 B2 | 4/2013 | Dong et al. | |
| 2009/0102566 A1* | 4/2009 | McCoy | G06F 1/04 331/49 |
| 2009/0295488 A1* | 12/2009 | Zeng | H03L 7/099 331/2 |
| 2011/0204937 A1* | 8/2011 | Demirkan | H03L 7/087 327/157 |
| 2011/0234331 A1* | 9/2011 | Ding | H03B 5/1212 331/36 C |
| 2013/0040583 A1* | 2/2013 | Kim | H03L 7/0995 455/84 |
| 2013/0328632 A1* | 12/2013 | Tomita | H03L 7/18 331/16 |
| 2016/0156310 A1* | 6/2016 | Pretl | H04B 1/40 331/60 |

* cited by examiner

*Primary Examiner* — Adam Houston
(74) *Attorney, Agent, or Firm* — Martin & Associates, LLC; Bret J. Petersen

(57) ABSTRACT

A phased locked loop (PLL) incorporates multiple voltage controlled oscillators including one that operates in a lower frequency range than an operational VCO used by the PLL. A VCO selection circuit allows the system to select from one or more alternate VCOs. A ring oscillator VCO may be used as the alternate VCO for a PLL that uses a LC VCO for the operational VCO. While the ring oscillator VCO provides lower performance, the ring oscillator VCO allows the system with the PLL to be run at a lower speed for testing, debugging or characterization.

20 Claims, 3 Drawing Sheets

PHASED LOCKED LOOP WITH MULTIPLE VOLTAGE CONTROLLED OSCILLATORS

BACKGROUND

1. Technical Field

This disclosure generally relates to phase locked loops (PLLs), and more specifically relates to a PLL with multiple voltage controlled oscillators having different frequency ranges including a high frequency ring voltage controlled oscillator.

2. Background Art

A phase-locked loop or phase lock loop (PLL) is a control system that generates an output signal whose phase is related to the phase of an input signal. Phase-locked loops are widely employed in radio, telecommunications, computers and other electronic applications. PLLs often employ voltage controlled oscillators (VCOs) to generate a variable high frequency signal required by the PLL. One typical use of a PLL is in a high speed serializer/deserializer (HSS). Serializer/deserializer is often shortened to SerDes (pronounced sir-deez).

A SerDes is a pair of functional blocks commonly used in high speed communications to compensate for limited input/output. These blocks convert data between serial data and parallel interfaces in each direction. The primary use of a SerDes is to provide serial data transmission over a single/differential line in order to minimize the number of I/O pins and interconnects for the transmission of the data.

BRIEF SUMMARY

A high frequency PLL typically employs a LC voltage controlled oscillator (VCO). The LC VCO is one specific type of VCO that uses an inductor (L) and capacitor (C) for the oscillator. While a LC VCO typically provides the best jitter characteristics, they typically suffer from a very narrow frequency range, and they use a large area on the silicon. In a system with a LC VCO there is often a need to run the system at slower speeds. For example, a high speed serializer/deserializer (HSS) core using an LC VCO in the PLL may not be able to operate at its targeted speed due to a bug or process problem, in this case it would be helpful to bring up the system at a lower speed despite the bug or process problem because of the time and cost required for a new core design to fix the problem. The slower speed can be used for system characterization, debugging and margin testing. Even with an operational LC VCO, margin testing is not always possible with the LC VCO because the LC VCO frequency range is too narrow.

The disclosure and claims herein are directed to a phased locked loop (PLL) that incorporates multiple voltage controlled oscillators including one that operates in a lower frequency range than an operational VCO used by the PLL. A VCO selection circuit allows the system to select from one or more alternate VCOs for the PLL. A ring oscillator VCO may be used as the alternate VCO for a PLL that uses a LC VCO for the operational VCO. While the ring oscillator VCO provides lower performance, the ring oscillator VCO allows the system with the PLL to be run at a lower speed for testing, debugging and characterization.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

The disclosure and claims herein relate to a phased locked loop (PLL) that incorporates multiple voltage controlled oscillators including a one that operates in a lower frequency range than an operational VCO used by the PLL. A VCO selection circuit allows the system to select from one or more alternate VCOs. A ring oscillator VCO may be used as the alternate VCO for a PLL that uses a LC VCO for the operational VCO. While the ring oscillator VCO provides lower performance, the ring oscillator VCO allows the system with the PLL to be run at a lower speed for testing, debugging and characterization.

Figure 1:
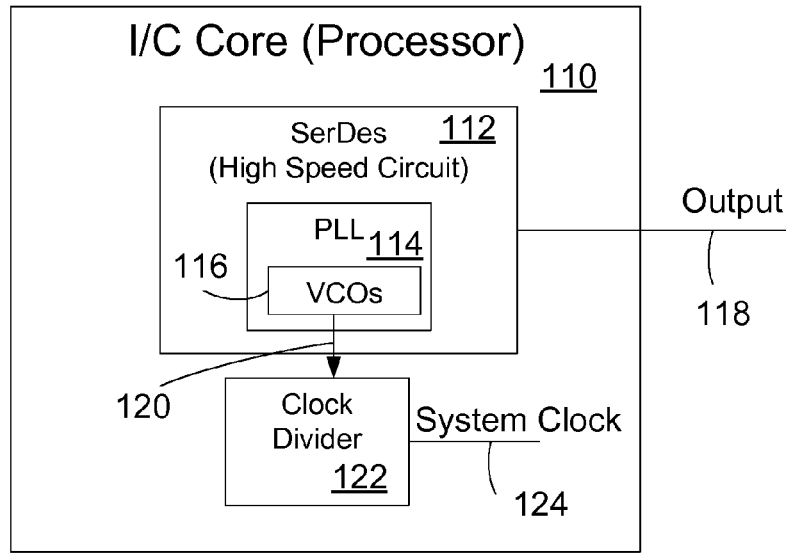
FIG. 1 is a simplified block diagram of an integrated circuit core with a PLL having an alternative voltage controlled oscillator that operates in lower frequency ranges than the operational LC VCO.

Referring to FIG. 1, a simplified block diagram illustrates an integrated circuit (I/C) core 110. The I/C core 110 may be any I/C design that incorporates a high speed circuit with a PLL as described herein. In the illustrated example of FIG. 1, the I/C core 110 is a processor core and the high speed circuit is a SerDes 112. The SerDes 112 uses a PLL 114 that has two or more selectable VCOs 116, including a high frequency ring VCO that operates in lower frequency ranges than the operational VCO as described herein. The VCO 116 outputs a clock signal 120 to a clock divider 122. The clock divider 122 divides the frequency of the clock signal 120 to output a lower frequency system clock 124. The I/C core 110 uses the divided clock signal or system clock 124 as a general purpose clock signal. This divided clock signal is used for a variety of reasons. First, the LC VCO provides a good quality clock signal with low jitter. Second, since the PLL 114 already has a LC VCO with the needed clock characteristics, there is no need to use significant I/C real estate to fabricate another LC circuit for a clock. However, using the LC VCO to generate the system clock 124 creates additional concerns during chip development and testing.

Again referring to FIG. 1, the SerDes 112 includes a PLL 114 with VCO 116. In this example the VCO 116 is a LC voltage controlled oscillator (VCO). While a LC VCO provides the best jitter characteristics, they typically suffer from a very narrow frequency range, difficulty in starting them up, and they use a large area on the silicon. In a system with a LC VCO there is often a need to run the system with the PLL at slower speeds. For example, during development, an HSS core using an LC VCO in the PLL may not be able to operate at its targeted speed due to a bug or process problem in the HSS resulting in the developers being unable to bring up the chip for testing. Without another clock, testing on the I/C core 110 could not continue. In addition, it may be helpful during characterization or testing to have a system clock 124 that is slower than that provided by the LC VCO to test system performance margins or debug the system. These operations are not possible with the PLL using an LC VCO because the LC VCO frequency range is too narrow. In the illustrated example, the SerDes 112 uses a PLL 114 that has selectable VCOs 116 including a high frequency ring VCO that operates in lower frequency ranges than the operational VCO as described further below. The high frequency ring VCO has greater jitter characteristics than is acceptable during normal operation of the electronic circuit but is acceptable for testing and debugging.

Figure 2:
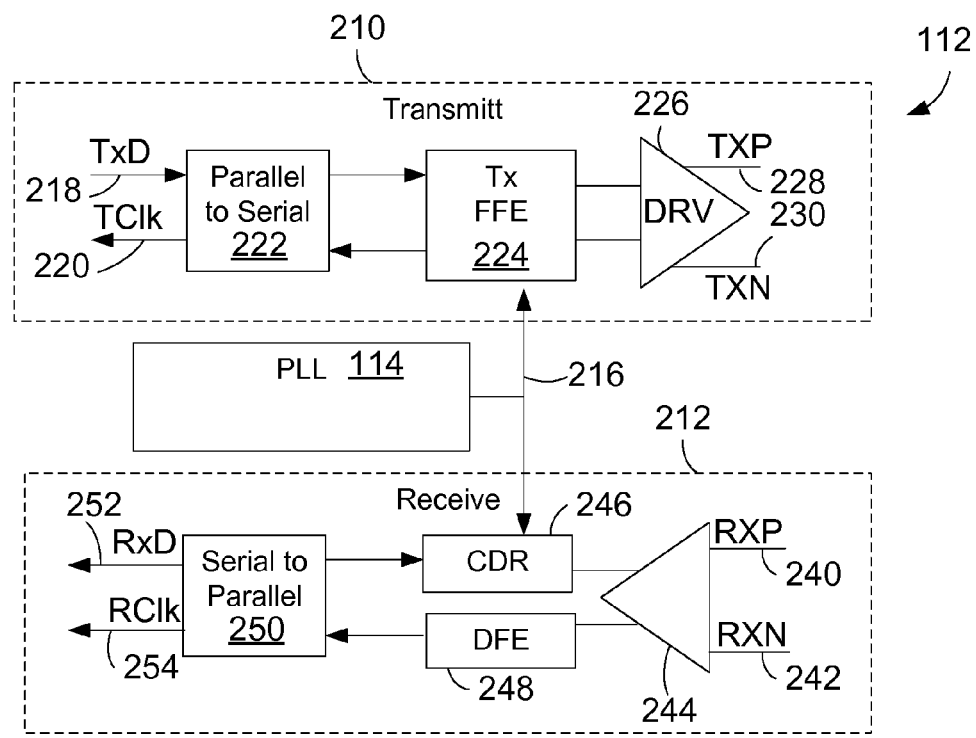
FIG. 2 is a simplified block diagram of a SERDES shown in FIG. 1.

FIG. 2 illustrates a simplified block diagram of a serializer/deserializer (SerDes) 112 introduced in FIG. 1. A SerDes is a pair of functional blocks commonly used in high speed communications to provide serial data transmission over a single/differential line. These blocks convert data between serial data and parallel interfaces in each direction. The SerDes 112 in the illustrated example is similar to prior art SerDes circuits except for the PLL 114, which is described further below. A variety of SerDes architectures may be used in conjunction with the PLL described herein. In the example shown in FIG. 2, the SerDes 112 includes a transmit block 210 and a receive block 212. Both the transmit block 210 and the receive block 212 use a clock signal 216 provided by the PLL 114. The PLL 114 is described in further detail with reference to FIG. 3 below. The transmit block 210 receives a digital transmit input 218 and outputs a transmit clock 220. The digital transmit input 218 is connected to a parallel to serial circuit 222 that converts a parallel digital signal on the digital transmit input to a serial stream of data. In this example, the serial data is sent to a feed forward equalizer (FFE) 224. The FFE synchronizes the serial data with the clock signal 216 and provides a synchronized data signal to the driver 226. The driver 226 outputs a serial differential transmit signal illustrated as transmit positive 228 and transmit negative 230.

Again referring to FIG. 2, the SerDes 112 includes the receive block 212 as introduced above. The receive block 212 receives a differential receive signal that comprises a receive-positive signal 240 and receive-negative signal 242 into receiver 244. The receiver 244 drives a decision feedback equalization (DFE) circuit which provides a filtered signal to the serial to parallel circuit 250. The receiver 244 further connects to a clock data recovery (CDR) circuit 246 that recovers the data to send to the serial to parallel circuit 250. The parallel circuit 250 outputs receiver data 252 and a receiver clock 254.

Figure 3:
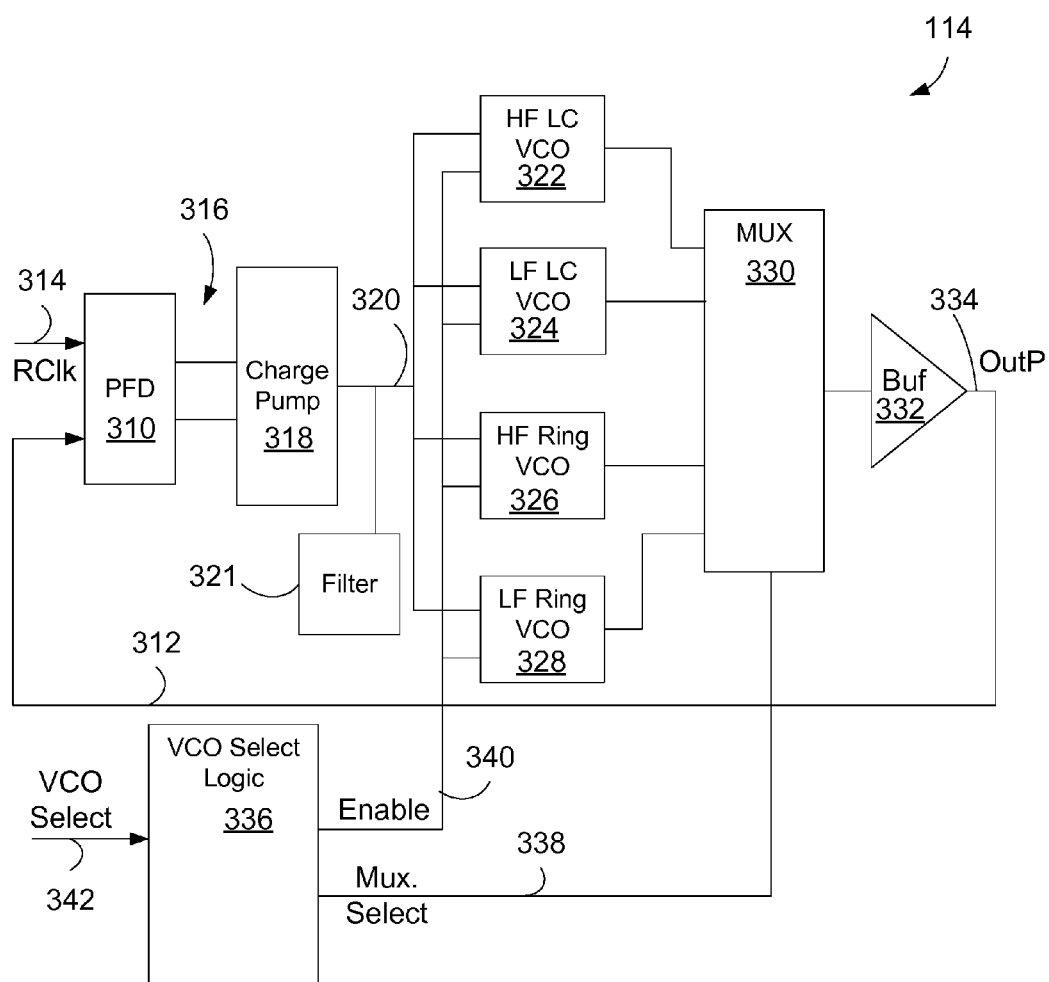
FIG. 3 is a block diagram of a phase locked loop circuit as introduced in FIG. 1.

FIG. 3 is a block diagram of the phased locked loop 114 introduced in FIG. 1. A phase locked loop (PLL) is a control system that generates an output signal that has a phase that is related to the phase of an input signal. The PLL primarily consists of a variable frequency controlled oscillator and a phase detector. The oscillator generates a periodic signal. The phase detector compares the phase of that signal with the phase of the input periodic signal and adjusts the oscillator to keep the phases matched. Bringing the output signal back toward the input signal for comparison is called a feedback loop since the output is "fed back" toward the input forming a loop. If the output phase drifts, the error signal will increase, driving the VCO phase in the opposite direction so as to reduce the error. Thus the output phase of the PLL is locked to the phase of a reference clock input. By keeping the input and output phase in lock step the PLL keeps the input and output frequencies the same.

In the example PLL shown in FIG. 3, a phase frequency detector (PFD) 310 compares a feedback signal 312 with a reference clock 314 and produces a current source error signal 316 which is proportional to the phase difference of these two inputs. The current source error signal 316 is sent to a charge pump 318. The current source error signal 316 is used by the charge pump 318 to produce a drive signal 320 to drive a VCO. In this example, the charge pump 318 drives the VCO that is selected as described below. The PLL 114 may include a filter 321 at the output of the charge pump 318. In the illustrated example, there are four VCOs 322, 324, 326, 328. The four VCOs 322, 324, 326, 328 are described further below. An output from each of the VCOs 322, 324, 326, 328 is connected to a multiplexor 330. The multiplexor 330 has an output that is buffered by buffer circuit 332 to provide the output 334 of the PLL. The output 334 also provides the feedback signal 312 as described above.

Again referring to the example shown in FIG. 3, the PLL 114 further includes VCO select logic 336 that provides a multiplexor select signal 338. The multiplexor select signal 338 drives the multiplexor 330 to select which of the outputs from the VCOs 322, 324, 326, 328 to connect to the buffer circuit 332. The multiplexor select signal 338 may be comprised of two or three discrete signals for the 4 to 1 multiplexor used in this example. For example, one of ordinary skill in the art would recognize that if the multiplexor 330 is implemented with three 2:1 multiplexors in two stages a single signal is need to drive each of the three 2:1 multiplexors (not shown). The VCO select logic 336 also provides a VCO enable signal 340. The VCO enable signal 340 may include one or more connections to the VCOs 322, 324, 326, 328 to selectively enable the VCO that is currently being selected by the multiplexor 330 and being used by the PLL circuit 114. Selectively enabling one of the VCOs allows for the remaining VCOs to be disabled when not being used to conserve power. The VCO select logic 336 includes a VCO select input 342. In this example, the VCO select input 342 is a two bit input driven by other logic (not shown) in the I/C core 110 to select which VCO to use for the PLL 114 depending on the current system needs for testing or debugging as described herein.

Again referring to the example in FIG. 3, the PLL 114 includes four VCOs, namely, a high frequency LC VCO 322, a low frequency LC VCO 324, a high frequency ring VCO 326, and a low frequency ring VCO 328. In this example, the high frequency LC VCO 322 is the operational VCO, or the VCO that is used during normal operation. The high frequency LC VCO 322 used during normal operation for a HSS may operate in the 30 GHz range. The low frequency LC VCO 324 is an alternate operational VCO. The alternate or low frequency LC VCO may also be used during normal operation but provide a different frequency of operation compared to the high frequency LC VCO 322. For example, the low frequency LC VCO 324 may operate in the 16 GHz range. The frequency of the high frequency LC VCO 322 is 30 GHz+/−about 10% and the frequency of the low frequency LC VCO 324 is 16 GHz+/−about 10%.

In addition to the LC VCOs 322, 324, the PLL 114 may also have one or more additional VCOs that have a wider frequency band to use for testing. In the example illustrated in FIG. 3, the PLL 114 has a high frequency ring VCO 326 and a low frequency ring VCO 328. The frequency range of a ring VCO is several times greater than that of the LC VCOs 322, 324. The High frequency ring VCO 326 in this example may be configured to operate in the 16 to 30 GHz range and the low frequency ring VCO 328 may be configured to run from 16 GHz down to about 9 GHz or less. This would allow the system to select from a wide frequency range for testing and debugging.

Again referring to the example in FIG. 3, an alternative embodiment will be described. Instead of having four VCOs as shown in FIG. 3, in this example the low frequency LC VCO 324 and the low frequency ring VCO 328 are eliminated. Thus, in this example the PLL 114 includes two VCOs, namely, a high frequency LC VCO 322, and a high frequency ring VCO 326. The High frequency ring VCO 326 in this example may be configured to operate in the 9 to 30 GHz range to give a frequency range significantly below the operating range of the high frequency LC VCO 322 at about 30 GHz.

Figure 4:
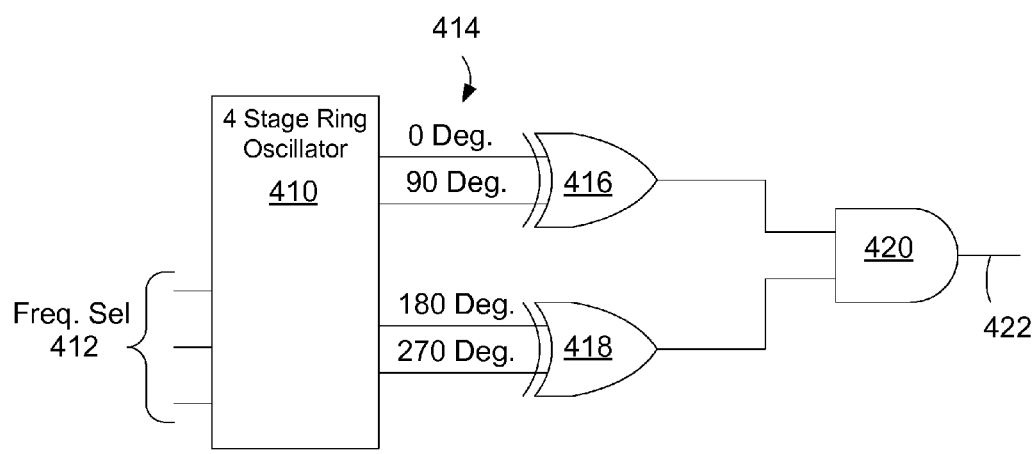
FIG. 4 is a block diagram of a high speed ring oscillator circuit.

FIG. 4 illustrates a block diagram of a high frequency ring oscillator 400. The high frequency ring oscillator 400 includes a 4 stage ring oscillator 410. The 4 stage ring oscillator 410 is similar to ring oscillators known in the prior art. The 4 stage ring oscillator 410 inputs a frequency select input 412 that is driven by other logic (not shown) in the I/C core 110 to select a frequency for the PLL 114 depending on the current system needs for testing or debugging. The 4 stage ring oscillator 410 outputs a high frequency clock depending on the frequency select input 420. In this example, the 4 stage ring oscillator 410 has four outputs 114 of the high frequency clock at 90 degrees offset from each other. The four outputs 114 are connected to the inputs of two exclusive OR circuits 416, 418. The outputs of the exclusive OR circuits are ANDed together with an AND gate 420. The output 422 of the AND gate 420 then provides a high frequency clock that is four times the currently selected frequency of the 4 stage ring oscillator 410. The 4 stage ring oscillator connected as shown may provide a high frequency clock for the PLL 114 shown in FIG. 2. For example the 4 stage ring oscillator 410 connected as shown may provide a variable high frequency clock in the range between 9 and 30 GHz.

The disclosure and claims herein relate to a phased locked loop (PLL) that incorporates multiple voltage controlled oscillators including a ring oscillator VCO that operates in a lower frequency range than an operational VCO used by the PLL. While the ring oscillator VCO provides lower performance, the ring oscillator VCO allows the system with the PLL to be run at a lower speed for more robust margin testing, debugging and characterization.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An electronic circuit comprising:
a phased locked loop with a plurality of voltage controlled oscillators that each provides a variable high frequency signal required for the phased locked loop;
a first voltage controlled oscillator of the plurality of voltage controlled oscillators;
a second voltage controlled oscillator of the plurality of voltage controlled oscillators that is of a different type than the first voltage controlled oscillator and provides a frequency lower than the first voltage controlled oscillator with a greater frequency range than the first voltage controlled oscillator;
a multiplexor that inputs an output from each of the first and second voltage controlled oscillators and provides an output frequency for the phased locked loop; and
select logic connected to the multiplexor that selects whether the multiplexor uses the output from the first voltage controlled oscillator or the output from the second voltage controlled oscillator for the phased locked loop.

2. The electronic circuit of claim 1 wherein the first voltage controlled oscillator is an inductor/capacitor (LC) voltage controlled oscillator.

3. The electronic circuit of claim 1 wherein the second voltage controlled oscillator is a high frequency ring voltage controlled oscillator.

4. The electronic circuit of claim 1 wherein the high frequency ring voltage controlled oscillator comprises a four stage ring oscillator with a selectable frequency.

5. The electronic circuit of claim 1 wherein the first voltage controlled oscillator is used in normal operation of the PLL and the second voltage controlled oscillator is used for testing and debugging.

6. The electronic circuit of claim 5 wherein the first voltage controlled oscillator used in normal operation operates at about 30 GHz and the second voltage controlled oscillator used for testing and debugging operates between about 9 and 30 GHz.

7. The electronic circuit of claim 1 wherein the second voltage controlled oscillator has greater jitter characteristics than is acceptable during normal operation of the electronic circuit but is acceptable for testing and debugging.

8. An electronic circuit comprising:
a core for an integrated circuit that includes a high speed circuit for outputting a signal;
a phased locked loop in the high speed circuit having a plurality of voltage controlled oscillators that can each provide a variable high frequency signal required for the phased locked loop, the phased locked loop comprising:
a first voltage controlled oscillator of the plurality of voltage controlled oscillators;
a second voltage controlled oscillator of the plurality of voltage controlled oscillators that is of a different type than the first voltage controlled oscillator and provides a frequency lower than the first voltage controlled oscillator with a greater frequency range than the first voltage controlled oscillator;
a multiplexor that inputs an output from each of the first and second voltage controlled oscillators and provides an output frequency for the phased locked loop; and
select logic connected to the multiplexor that selects whether the multiplexor uses the output from the first voltage controlled oscillator or the output from the second voltage controlled oscillator for the phased locked loop; and
a clock divider that inputs a signal from the output of the multiplexor to use as a system clock for the integrated circuit.

9. The electronic circuit of claim 8 wherein the first voltage controlled oscillator is an inductor/capacitor (LC) voltage controlled oscillator.

10. The electronic circuit of claim 8 wherein the second voltage controlled oscillator is a high frequency ring voltage controlled oscillator.

11. The electronic circuit of claim 8 wherein the high frequency ring voltage controlled oscillator comprises a four stage ring oscillator with a selectable frequency.

12. The electronic circuit of claim 8 wherein the first voltage controlled oscillator is used in normal operation of the PLL and the second voltage controlled oscillator is used for testing and debugging.

13. The electronic circuit of claim 12 wherein the first voltage controlled oscillator used in normal operation operates at about 30 GHz and the second voltage controlled oscillator used for testing and debugging operates between about 9 and 30 GHz.

14. The electronic circuit of claim 8 wherein the second voltage controlled oscillator has greater jitter characteristics than is acceptable during normal operation of the electronic circuit but is acceptable for testing and debugging.

15. An electronic circuit comprising:
a processor core for an integrated circuit that includes a high speed serializer/deserializer for outputting a signal;
a phased locked loop in the serializer/deserializer having a plurality of voltage controlled oscillators that can each provide a variable high frequency signal required for the phased locked loop, the phased locked loop comprising:
a first inductor/capacitor (LC) voltage controlled oscillator;
a first high frequency ring voltage controlled oscillator that provides a greater frequency range than the first inductor/capacitor voltage controlled oscillator;
a multiplexor that inputs an output from the inductor/capacitor voltage controlled oscillator and an output from the first high frequency ring voltage controlled oscillator to provide an output frequency for the phased locked loop;
select logic connected to the multiplexor that selects whether the multiplexor uses the output from the first inductor/capacitor (LC) voltage controlled oscillator or the output from the first high frequency ring voltage controlled oscillator for the phased locked loop; and
a clock divider that inputs a signal from the output of the multiplexor to use as a system clock for the processor core.

16. The electronic circuit of claim 15 wherein the first high frequency ring voltage controlled oscillator comprises a four stage ring oscillator with a selectable frequency.

17. The electronic circuit of claim 15 wherein the first inductor/capacitor (LC) voltage controlled oscillator is used in normal operation of the PLL and the first high frequency ring voltage controlled oscillator is used for testing and debugging.

18. The electronic circuit of claim 17 wherein the first inductor/capacitor (LC) voltage controlled oscillator used in normal operation operates at about 30 GHz and the first high frequency ring voltage controlled oscillator used for testing and debugging operates between about 9 and 30 GHz.

19. The electronic circuit of claim 15 wherein the first high frequency ring voltage controlled oscillator has greater jitter characteristics than is acceptable during normal operation of the electronic circuit but is acceptable for margin testing and debugging.

20. The electronic circuit of claim 15 further comprising a second inductor/capacitor (LC) voltage controlled oscillator used in normal operation operates at about 16 GHz and a second high frequency ring voltage controlled oscillator operates in about the 9 to 16 GHz range, wherein the first inductor/capacitor (LC) voltage controlled oscillator used in normal operation operates at about 30 GHz and the first high frequency ring voltage controlled oscillator used for testing and debugging operates between about 16 to 30 GHz.

* * * * *